(12) United States Patent
Rathke et al.

(10) Patent No.: US 9,668,366 B2
(45) Date of Patent: May 30, 2017

(54) HOUSING UNIT FOR ELECTRICAL COMPONENTS FOR USE IN THE AUTOMOBILE SECTOR

(75) Inventors: Ronald Rathke, Doebeln (DE); Michael Weinert, Leisnig (DE); Wolfgang Zacher, Doebeln (DE); René Patzner, Hohenstein-Ernstthal (DE)

(73) Assignee: PIERBURG PUMP TECHNOLOGY GMBH, Neuss (DE)

( * ) Notice: Subject to any disclaimer, the term of this patent is extended or adjusted under 35 U.S.C. 154(b) by 392 days.

(21) Appl. No.: 14/113,817

(22) PCT Filed: Apr. 27, 2011

(86) PCT No.: PCT/EP2011/056615
§ 371 (c)(1),
(2), (4) Date: Oct. 25, 2013

(87) PCT Pub. No.: WO2012/146275
PCT Pub. Date: Nov. 1, 2012

(65) Prior Publication Data
US 2014/0057545 A1    Feb. 27, 2014

(51) Int. Cl.
*H05K 5/02* (2006.01)
*H05K 5/00* (2006.01)
*H05K 5/06* (2006.01)

(52) U.S. Cl.
CPC ......... *H05K 5/0213* (2013.01); *H05K 5/0056* (2013.01); *H05K 5/06* (2013.01)

(58) Field of Classification Search
CPC ........ H05K 5/06; H05K 5/0213; H05K 5/068; F16H 57/027; H02K 5/10; H02K 2205/09

USPC .......... 454/184; 174/520, 50.5, 547
See application file for complete search history.

(56) References Cited

U.S. PATENT DOCUMENTS

| | | |
|---|---|---|
| 6,506,110 B1 | 1/2003 | Borisch |
| 2003/0094101 A1* | 5/2003 | Hara ........... B29C 66/71 96/4 |
| 2008/0041624 A1 | 2/2008 | Sasaki et al. |
| 2008/0196918 A1* | 8/2008 | Zadach ........ H05K 5/0213 174/50.5 |
| 2009/0084078 A1* | 4/2009 | Furuyama ..... F21S 48/335 55/385.4 |

(Continued)

FOREIGN PATENT DOCUMENTS

| | | |
|---|---|---|
| DE | 195 44 974 C1 | 5/1997 |
| DE | 10 2004 056 662 A1 | 6/2006 |
| DE | 102007012703 A1 * | 6/2008 ........... F16H 57/027 |

(Continued)

*Primary Examiner* — Steven B McAllister
*Assistant Examiner* — Ko-Wei Lin
(74) *Attorney, Agent, or Firm* — Norman B. Thot

(57) ABSTRACT

A housing unit for electrical components for use in the automobile sector includes a housing part configured to be closed in a sealed manner by a housing cover arrangement. The housing cover arrangement comprises a membrane, at least one ventilation opening, a main cover element comprising a recess, and a cover closure element. The recess comprises an opening which is configured to be closed in a sealed manner by the membrane. The opening comprises a rib arrangement which is configured to pretension the membrane. The cover closure element is configured to close the recess so as to provide the at least one ventilation opening.

9 Claims, 2 Drawing Sheets

(56) References Cited

U.S. PATENT DOCUMENTS

2009/0266815 A1    10/2009   Lauk et al.
2010/0187007 A1     7/2010   Trenner et al.

FOREIGN PATENT DOCUMENTS

| EP | 0 113 073 A1 | 7/1984 |
|----|---|---|
| EP | 1 313 359 A2 | 5/2003 |
| EP | 1 784 066 A1 | 5/2007 |
| JP | 61-116491 U | 7/1986 |
| JP | 2001-196754 A | 7/2001 |
| JP | 2006-41304 A | 2/2006 |
| JP | 2008-521225 A | 6/2008 |
| JP | 2010-504887 A | 2/2010 |
| JP | 2010-513813 A | 4/2010 |
| JP | 2010-521823 A | 6/2010 |
| WO | WO 88/09422 A1 | 12/1988 |
| WO | WO 99/29150 A1 | 6/1999 |

\* cited by examiner

HOUSING UNIT FOR ELECTRICAL COMPONENTS FOR USE IN THE AUTOMOBILE SECTOR

CROSS REFERENCE TO PRIOR APPLICATIONS

This application is a U.S. National Phase application under 35 U.S.C. §371 of International Application No. PCT/EP2011/056615, filed on Apr. 27, 2011. The International Application was published in German on Nov. 1, 2012 as WO 2012/146275 A1 under PCT Article 21(2).

FIELD

The present invention relates to a housing unit for electrical components for use in the automobile sector, comprising a housing part which can be closed in a sealed manner by a housing cover arrangement, wherein the housing cover arrangement has a membrane and at least one ventilation opening.

BACKGROUND

EP 0 113 073 A1 describes a housing unit with a housing part that accommodates an electric circuit, is protected from moisture by a membrane, and is sealingly closed by a cover serving for the mechanical protection of the membrane. For the purpose of providing a pressure balance in the housing, and to be able to thereby react to temperature changes and/or changes in the external pressure, the cover is provided with a ventilation bore. A housing unit of such design has the drawback that the membrane comes loose during a subsequent process of fitting the cover, for example, by ultrasonic welding, and that the electrical components are thus inevitably again exposed to moisture.

SUMMARY

An aspect of the present invention is to provide a housing unit for electrical components that avoids the above mentioned drawback in an economic manner.

In an embodiment, the present invention provides a housing unit for electrical components for use in the automobile sector which includes a housing part configured to be closed in a sealed manner by a housing cover arrangement. The housing cover arrangement comprises a membrane, at least one ventilation opening, a main cover element comprising a recess, and a cover closure element. The recess comprises an opening which is configured to be closed in a sealed manner by the membrane. The opening comprises a rib arrangement which is configured to pretension the membrane. The cover closure element is configured to close the recess so as to provide the at least one ventilation opening.

BRIEF DESCRIPTION OF THE DRAWINGS

The present invention is described in greater detail below on the basis of embodiments and of the drawings in which.

DETAILED DESCRIPTION

In an embodiment of the present invention, the housing cover arrangement has a main cover element having a recess, wherein an opening is provided in the recess, which can be closed in a sealed manner by the membrane, wherein the opening has a rib arrangement which pretensions the membrane, and wherein a cover closure element is provided which closes the recess with at least one ventilation opening. Due to the fact that the opening of the recess of the main cover element is provided with a rib arrangement that pretensions the membrane, a fluttering or beating of the membrane is prevented during an assembly process, such as an ultrasonic welding of the cover closure element or the housing cover arrangement, such that the membrane is fixed properly and sealingly.

In an embodiment of the present housing unit, the cover closure element has a diameter which is smaller than the largest diameter of the recess and which is material-bonded to support elements of the recess such that ventilation openings are provided in the circumferential portion of the cover closure element. Moisture or water vapor can thus drain or evaporate from the housing unit.

In an embodiment based on assembly techniques, it may be advantageous if the main cover element comprises centering elements for the cover closure element. The rib arrangement can, for example, be formed with a star shape.

In an embodiment of the present invention, the funnel-like design of the recess provides that water can flow from the recess in a simple manner.

Figure 1:
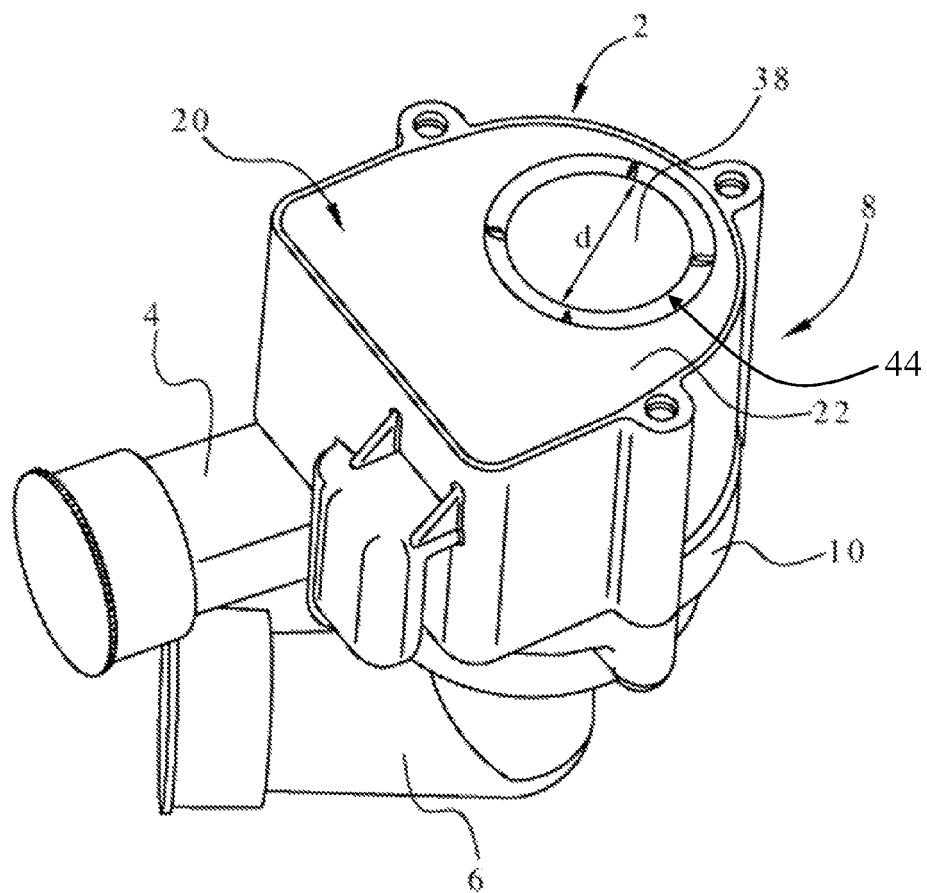
FIG. 1 shows a perspective view of a water circulation pump for motor vehicles, with the cover removed.

FIG. 1 is a perspective view of a water circulation pump 2 with an inlet port 4 and an outlet port 6. A housing unit 8 is further provided followed by a pump mechanism 10 which itself is connected with the inlet port 4 and the outlet port 6.

The housing unit 8 comprises a circuit board 12 with electrical components 14, 16, 18 (see FIG. 2) that serve to control the water circulation pump. The housing unit 8 is adapted to be closed in a sealing manner by means of a housing cover arrangement. In an embodiment of the present invention, the housing cover arrangement 20 consists of a main cover element 22 with a recess 24. The recess 24 is funnel-shaped so that water in the recess 24 can flow off in any mounting position and has an opening 26 with a star-shaped rib arrangement which is raised towards the center of the opening 32 with respect to the circumferential surface 30 of the opening such that a membrane 34 that closes the opening 26 is pretensioned. This pretensioning of the membrane 34 prevents a fluttering or beating during a subsequent assembly process, for example, by ultrasonic welding, so that the membrane 34 is not damaged during the assembly process. The recess 24 further comprises support elements 36, each having a rib for material bonding with a cover closure element 38 by means of ultrasonic welding. The diameter d of the cover closure element 38 is smaller than the largest diameter D of the main cover element 22. In this manner, a sort of ventilation opening is created along the entire circumferential zone of the cover closure element 38, whereby liquid can flow off in a simple manner in any mounting position. For a simple assembly of the cover closure element 38, centering elements 40 are provided which define the mounting position of the cover closure element 38 in the mounted state.

With such an arrangement, in the event of temperature changes and/or changes in the outside pressure, for example, pressure equalization can take place in the housing part including the circuit board 12 and the electrical components 14 to 18. The cover closure element 38 protects the membrane 34 from mechanical influences. A draining of liquid or water vapor is provided in any mounting position.

Figure 2:
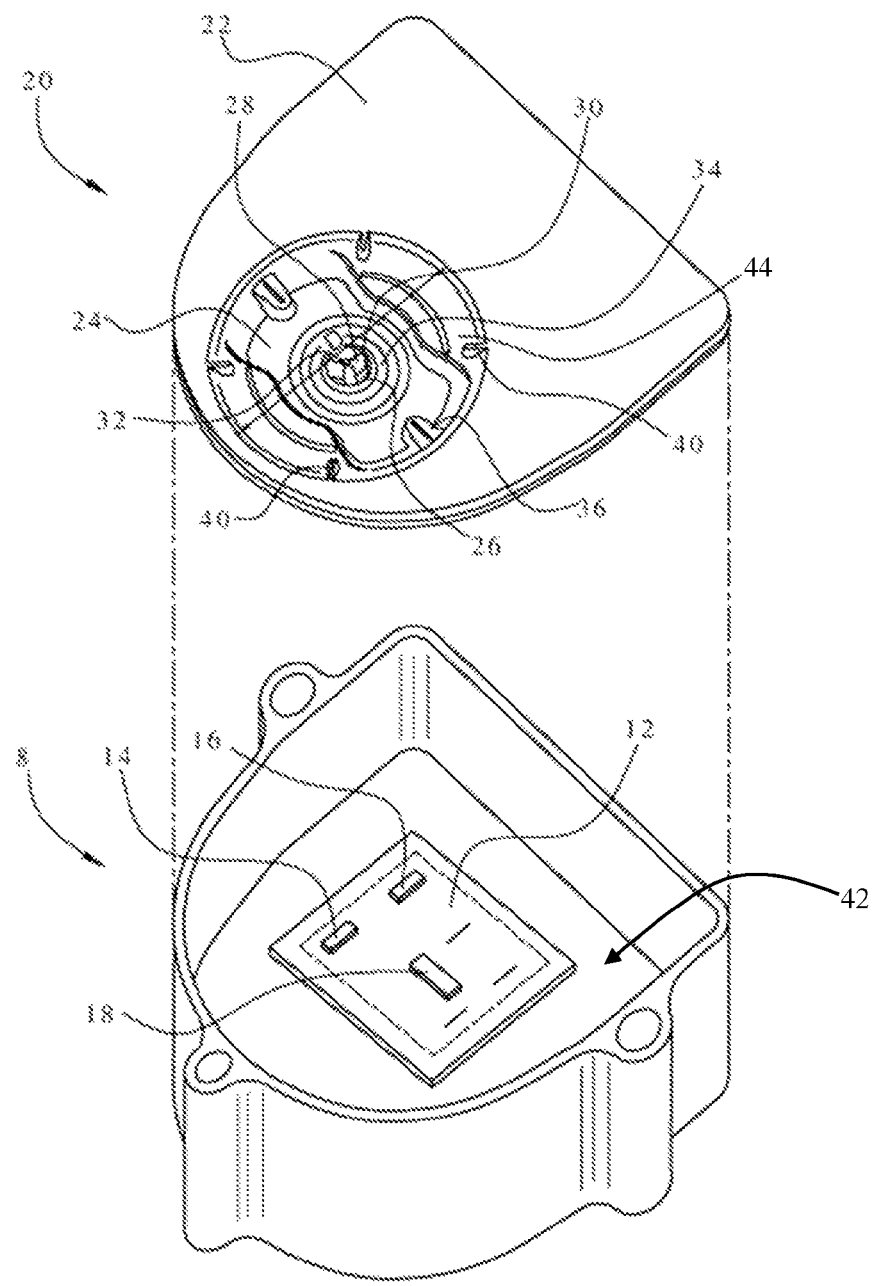
FIG. 2 shows a sectional view of the housing unit for electrical components of the water circulation pump.

FIG. 2 is a sectional view of the housing unit 8. The arrangement of the circuit board 12 with the electrical components 14, 16 and 18 can here be seen. The space 42 in which the circuit board 12 and the electrical components 14, 16 and 18 are accommodated is closed in a sealing manner by the main cover element 20 with the membrane 34.

In this context, the raised nature of the rib arrangement 28 can be seen, resulting in an umbrella-like spanning of the membrane 34. As describe above, the recess is closed by the cover closure element 38. Due to the smaller diameter d of the cover closure element 38, circumferential ventilation openings 44 are formed.

The present invention is not limited to embodiments described herein; reference should be had to the appended claims.

What is claimed is:

1. A housing unit for electrical components for use in the automobile sector, the housing unit comprising:
   a housing part configured to be closed in a sealed manner by a housing cover arrangement, the housing cover arrangement comprising:
      a membrane,
      at least one ventilation opening,
      a main cover element comprising a recess, the recess comprising support elements, a largest diameter and an opening which is configured to be closed in a sealed manner by the membrane, the opening comprising a circumferential surface and a rib arrangement which is raised in a center of the opening with respect to the circumferential surface so that the rib arrangement contacts and pretensions the membrane, and
      a cover closure element configured to close the recess so as to provide the at least one ventilation opening, the cover closure element being configured to protect the membrane from mechanical influences, the cover closure element comprising a largest diameter and a circumferential zone,
   wherein, the cover closure element is not the rib arrangement.

2. The housing unit as recited in claim 1, wherein, the largest diameter of the cover closure element is smaller than the largest diameter of the recess, and the cover closure element is configured to be materially bonded with the support elements of the recess so as to provide the at least one ventilation opening in the circumferential zone of the cover closure element.

3. The housing unit as recited in claim 1, wherein the main cover element further comprises centering elements for the cover closure element.

4. The housing unit as recited in claim 1, wherein the rib arrangement is star-shaped.

5. The housing unit as recited in claim 1, wherein the recess is funnel-shaped.

6. A housing unit for electrical components for use in the automobile sector, the housing unit comprising:
   a housing part configured to be closed in a sealed manner by a housing cover arrangement, the housing cover arrangement comprising:
      a membrane,
      at least one ventilation opening,
      a main cover element comprising a recess, the recess comprising support elements, a largest diameter and an opening which is configured to be closed in a sealed manner by the membrane, the opening comprising a circumferential surface and a rib arrangement which is raised in a center of the opening with respect to the circumferential surface so that the rib arrangement contacts and pretensions the membrane, and
      a cover closure element configured to close the recess so as to provide the at least one ventilation opening, the cover closure element being configured to protect the membrane from mechanical influences, the cover closure element comprising a largest diameter and a circumferential zone,
   wherein,
   the main cover element further comprises centering elements which define a mounting position of the cover closure element in a mounted state,
   each of the support elements comprises a rib which is configured to bond with the cover closure element; and
   the cover closure element is not the rib arrangement.

7. The housing unit as recited in claim 6, wherein, the largest diameter of the cover closure element is smaller than the largest diameter of the recess, and the cover closure element is configured to be materially bonded with the support elements of the recess so as to provide the at least one ventilation opening in the circumferential zone of the cover closure element.

8. The housing unit as recited in claim 6, wherein the rib arrangement is star-shaped.

9. The housing unit as recited in claim 6, wherein the recess is funnel-shaped.

* * * * *